United States Patent [19]

Cooperman et al.

[11] Patent Number: 5,268,931
[45] Date of Patent: Dec. 7, 1993

[54] DATA COMMUNICATION SYSTEM

[75] Inventors: Michael Cooperman, Framingham; Philip L. Andrade, Lexington, both of Mass.

[73] Assignee: GTE Laboratories Incorporated, Waltham, Mass.

[21] Appl. No.: 459,178

[22] Filed: Dec. 29, 1989

[51] Int. Cl.$^5$ ............................................. H04L 7/04
[52] U.S. Cl. .................................... 375/111; 328/38.1
[58] Field of Search ............ 375/111, 110, 87, 94–96, 375/106, 119; 328/55, 38.1; 307/605

[56] References Cited

U.S. PATENT DOCUMENTS 4,375,694  3/1983  Kuhn ................................. 375/120
4,542,420  9/1985  Kozlik et al. ......................... 375/87
4,843,331  6/1989  Yang .................................... 328/55

Primary Examiner—Douglas W. Olms
Assistant Examiner—Marianne Huseman
Attorney, Agent, or Firm—J. Stephen Yeo

[57] ABSTRACT

In a data communication system, apparatus provides a clock signal having a frequency of twice the frequency of a first clock signal. A time delay circuit delays the first clock signal by a time delay to provide a delayed first clock signal. An exclusive OR circuit is coupled to the first clock signal and the delayed first clock signal. The output of the exclusive OR is a second clock signal having a frequency twice the frequency of the first clock signal.

4 Claims, 2 Drawing Sheets

DATA COMMUNICATION SYSTEM

RELATED COPENDING APPLICATION

Concurrently filed patent application Ser. No. 07/459,176, by the same applicants as this, for METHOD FOR DATA COMMUNICATION, pertains to a method of using the system and apparatus divulged herein.

BACKGROUND OF THE INVENTION

This invention pertains to digital communication systems, and more particularly is concerned with clocking means to recover data in such systems.

Digital systems require a clock signal for data recovery. The maximum possible frequency of the data stream is for the condition of alternating ones and zeros (i.e., 0101010...). As a result, the clock frequency is exactly twice that of maximum data rate. In some systems the clock signal is sent with the data. Such a system must therefore be designed to operate at twice the speed of the data stream so as to carry the clock signal. For example, a data rate of 150 Mb/s requires the system to support a 300 Mb rate clock signal.

An object of this invention is to provide means to double the transmitted clock frequency to allow data to be sent at the maximum rate supported by the system.

SUMMARY OF THE INVENTION

Briefly, in a communication system apparatus doubles the frequency of a first clock signal. A time delay circuit delays the first clock signal by a time delay to provide a delayed first clock signal. The inputs of an exclusive OR circuit are separately coupled to the first clock signal and the delayed first clock signal. The output of the exclusive OR is a second clock signal having a frequency twice the frequency of the first clock signal.

DETAILED DESCRIPTION OF THE INVENTION

Figure 1:
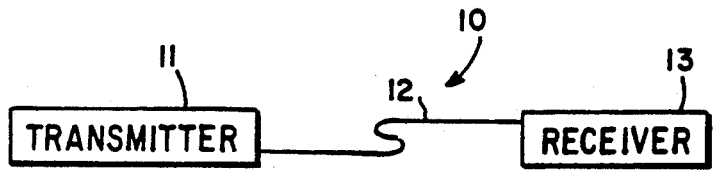
FIG. 1 is a schematic representation of a digital transmission system embodying the invention.

FIG. 1 is a schematic representation of a digital transmission system 10 in which both digital data and a clock signal are sent from a transmitter 11 over transmission media 12 to a receiver 13.

Figure 2:
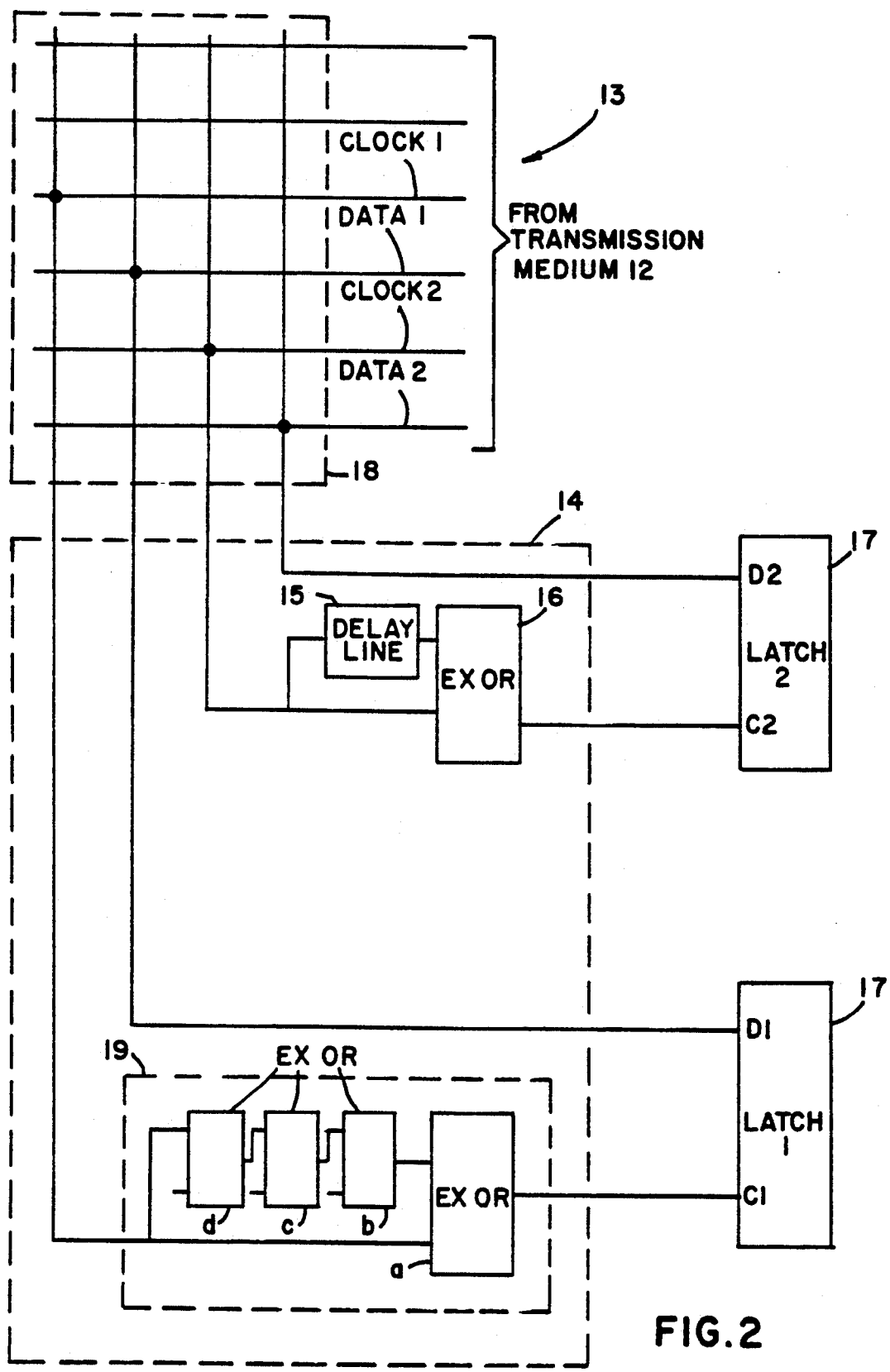
FIG. 2 is a diagram of a receiver used in the system of FIG. 2.

As a feature of the invention, receiver 13 includes a logic circuit 14, seen in FIG. 2, which doubles the transmitted clock frequency at the destination thereby allowing the transmitted clock frequency to be the same as that of the maximum data rate. This makes it possible for the system to transmit data at twice the data rate allowed by conventional systems which transmit a clock signal at a frequency double that of the data rate.

Figure 3:
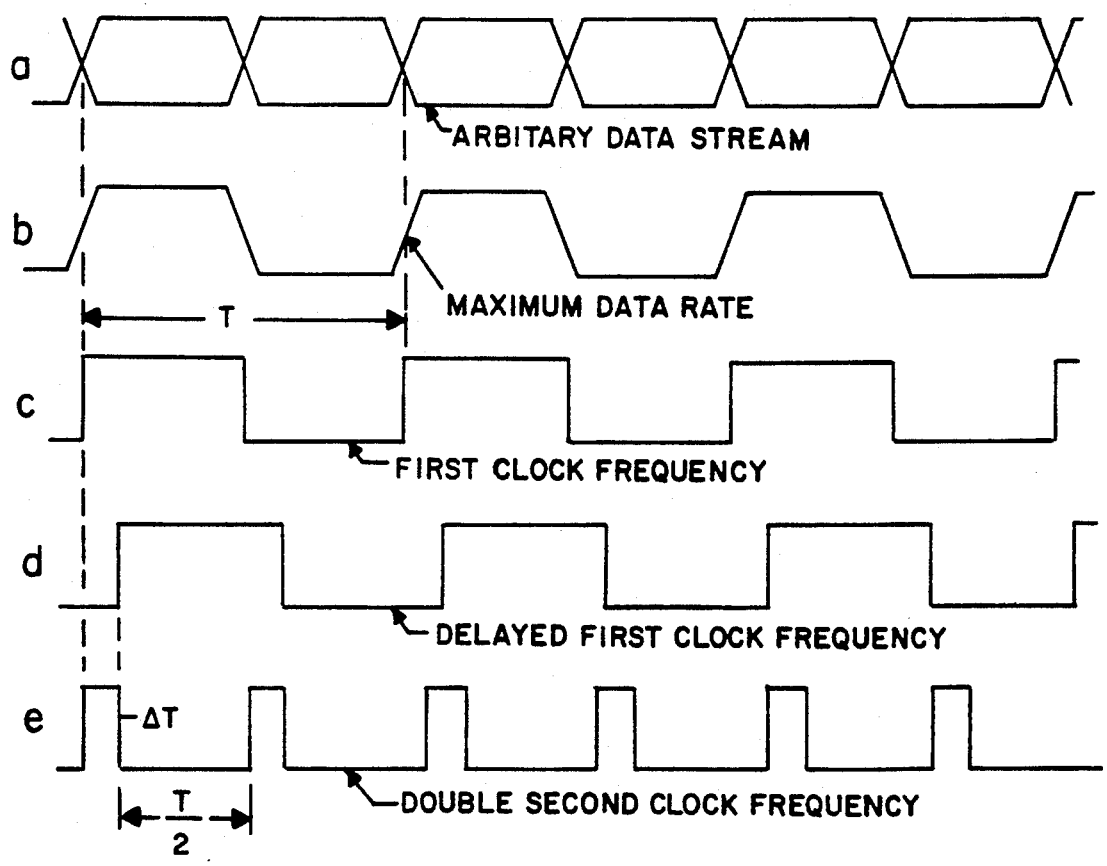
FIG. 3 represents a data stream and clock signals in the system of FIG. 1.

In keeping with the invention the transmitted or primary clock signal has the same frequency as the data rate, as shown in FIG. 3. The clock signal is a series of pulses. Each pulse has a pulse width equal to the inverse of the data rate, for example the pulse width corresponding to a data rate of 150 Mbits is about 6.6 nanoseconds.

Again referring to FIG. 2, logic circuit 14 includes a time delay circuit 15 which delays the first or primary clock signal by a time delay, preferably approximately one-half pulse width at the maximum bit rate of the system. (3.3 nanoseconds at 150 Mbits). resulting in a delayed first clock signal. At lower bit rates the time delay can remain the same, with corresponding lower duty cycles.

The delayed first clock signal is combined with the original first clock signal in an "exclusive OR" gate 16 to form the double frequency clock signal as shown in FIG. 3. Returning to FIG. 2, exclusive OR gate 16 has two inputs and an output. The first input is coupled to the first clock signal from media 12 and the second input is coupled to the the delayed first clock signal from delay circuit 15. Exclusive OR gate 16 provides an output level only when one pulse is present at either input. The output signal from exclusive OR gate 16 is a second clock signal having a frequency, 300 Mb, twice the 150 Mb data rate of the digital signal and the frequency of the first clock.

The positive clock transitions of the doubled clock frequency are generated by the primary clock. As a result slight variations in time delay due to circuit tolerances have no effect on the frequency doubling operation.

A latch 17 has an signal input coupled to the digital signal from media 12 and a clock input coupled to the output signal (second clock) from exclusive OR gate 16. The double frequency second clock is used to clock data into latch 17. The output of latch 17 is the recovered digital signal.

In one embodiment, a plurality of 150 Mb/s clock signals and data pairs are switched through a switch matrix 18. This could be any switch that provides equal input-output delays. Duplicates of the above described circuitry is provided for each clock data pair. Exclusive OR gates are commercially supplied in four gates per IC package. Consequently, two IC packages would be required for a 16×16 switch.

Delay circuit 16 is preferably implemented with a plurality of cascaded exclusive-OR gates. A modular implementation uses a four gate "exclusive OR" IC 19 for each clock output. One "exclusive OR" gate 19a is used to perform the "exclusive OR" function and the other "exclusive OR" gates 19b, 19c, and 19d are connected in series to form the required delay.

Alternatively a transmission line in series before an "exclusive OR" gate" is used for the delay.

The preferred embodiments and best mode of the invention have been described. Modifications and alternate embodiments will now be apparent to those skilled in the art. Accordingly the scope and breadth of the invention is defined by the claims.

What is claimed is:

1. A communication system comprising:
   a receiver;
   transmission media; and
   a transmitter for sending a digital signal and a first clock signal to said receiver through said transmission media,
   wherein said receiver includes,
   a time delay circuit for delaying first clock signal by a time delay to provide a delayed first clock signal;
   an exclusive OR gate having a first input coupled to said first clock signal, a second input coupled to said delayed first clock signal, and an output for providing a output signal only when one pulse is present at either input, wherein the output signal from said exclusive OR gate is a second clock signal having a frequency twice the frequency of said first clock signal; and a latch having a signal input coupled to said digital signal and a clock input coupled to said output signal from said exclusive OR gate and an output for providing a recovered digital signal.

2. The system of claim 1 wherein said time delay circuit is one or more exclusive OR gates connected in series.

3. Apparatus for recovering a digital signal having a data rate, received with a first clock signal having a series of pulses, each pulse having a pulse width equal to the inverse of said data rate, comprising:

a time delay circuit for delaying first clock signal by a time delay to provide a delayed first clock signal;

an exclusive OR gate having a first input coupled to said first clock signal a second input coupled to said delayed first clock signal, and an output for providing a output signal only when one pulse is present at either input, wherein the output signal from said exclusive OR gate is a second clock signal having a frequency twice the frequency of said first clock signal; and a latch having a signal input coupled to said digital signal and a clock input coupled to said output signal from said exclusive OR gate and an output for providing the recovered digital signal.

4. The apparatus of claim 3 wherein said time delay circuit is one or more exclusive OR gates connected in series.

* * * * *